(12) United States Patent
Kodaira

(10) Patent No.: US 8,941,228 B2
(45) Date of Patent: Jan. 27, 2015

(54) SEMICONDUCTOR MODULE AND MANUFACTURING METHOD THEREOF

(75) Inventor: Yoshihiro Kodaira, Matsumoto (JP)

(73) Assignee: Fuji Electric Co., Ltd, Kawasaki-shi ( * ) Notice: Subject to any disclaimer, the term of this patent is extended or adjusted under 35 U.S.C. 154(b) by 0 days.

(21) Appl. No.: 14/002,043

(22) PCT Filed: Nov. 15, 2011

(86) PCT No.: PCT/JP2011/076260
§ 371 (c)(1),
(2), (4) Date: Aug. 28, 2013

(87) PCT Pub. No.: WO2012/124209
PCT Pub. Date: Sep. 20, 2012

(65) Prior Publication Data
US 2013/0334676 A1    Dec. 19, 2013

(30) Foreign Application Priority Data

Mar. 16, 2011 (JP) .................. 2011-057804

(51) Int. Cl.
*H01L 23/498* (2006.01)
*H01L 21/768* (2006.01)
(Continued)

(52) U.S. Cl.
CPC ............ *H01L 23/498* (2013.01); *H01L 23/142* (2013.01); *H01L 23/24* (2013.01);
(Continued)

(58) Field of Classification Search
CPC ......... H01L 23/10; H01L 23/34; H01L 23/36; H01L 23/053; H01L 23/498; H01L 23/49811; H01L 21/76838; H01L 25/07; H01L 25/18; H01L 2924/0002; H01L 2924/00

USPC .......... 257/584, 678, 690, 693; 438/122, 125; 361/773
See application file for complete search history.

(56) References Cited

U.S. PATENT DOCUMENTS 5,408,128 A * 4/1995 Furnival ..................... 257/690
5,744,860 A   4/1998 Bayerer
(Continued)

FOREIGN PATENT DOCUMENTS

DE    3143339 A1    5/1983
EP    2216814 A2    8/2010
(Continued)

OTHER PUBLICATIONS

International Search Report dated Dec. 13, 2011, issued in corresponding application No. PCT/JP2011/076260.
(Continued)

*Primary Examiner* — Peniel M Gumedzoe
(74) *Attorney, Agent, or Firm* — Westerman, Hattori, Daniels & Adrian, LLP

(57) ABSTRACT

A semiconductor module is manufactured by bonding a resin case having a first opening through which surfaces of main circuit terminals and control terminals are exposed, onto a metal heat-dissipating substrate onto which is bonded, a conductive-patterned insulating substrate onto which are bonded, semiconductor chips, the main circuit terminals, and the control terminals; inserting into and attaching to a second opening formed on a side wall constituting a resin case, a resin body having a nut embedded therein to fix the main circuit terminals and the control terminals; and filling the resin case with a resin material. A side wall of the first opening is tapered toward the surface thereof; a tapered contact portion contacting the tapered side wall is disposed on the control terminal; and the resin body having the embedded nut fixes the control terminal having a one-footing structure that is an independent terminal.

7 Claims, 16 Drawing Sheets

(51) Int. Cl.
  *H01L 23/14* (2006.01)
  *H01L 23/24* (2006.01)
  *H01L 25/07* (2006.01)
(52) U.S. Cl.
  CPC .... *H01L23/49811* (2013.01); *H01L 21/76838* (2013.01); *H01L 25/072* (2013.01); *H05K 2201/10166* (2013.01); *H05K 2201/1031* (2013.01); *H01L 2924/0002* (2013.01)
  USPC ........... 257/690; 257/584; 257/678; 257/693; 438/122; 438/125

(56) References Cited

U.S. PATENT DOCUMENTS

| | | | | |
|---|---|---|---|---|
| 6,078,501 | A * | 6/2000 | Catrambone et al. | 361/704 |
| 7,768,109 | B2 * | 8/2010 | Nakao | 257/678 |
| 8,399,976 | B2 * | 3/2013 | Matsumoto et al. | 257/690 |

FOREIGN PATENT DOCUMENTS

| | | |
|---|---|---|
| JP | 07-066340 A | 3/1995 |
| JP | 09-321217 A | 12/1997 |
| JP | 09-331018 A | 12/1997 |
| JP | 2002-314038 A | 10/2002 |

OTHER PUBLICATIONS

Notification of Transmittal of Translation of the International Preliminary Report on Patentability (Form PCT/IB/338) of International Application No. PCT/JP2011/076260, mailing date of Sep. 26, 2013, with Forms PCT/IB/373, PCT/ISA/237, and PCT/IB/326.

Extended European Search Report dated Aug. 21, 2014, issued in corresponding Application No. 11860967.6. (12 pages).

* cited by examiner (a)

(b)

(a)

(b)

(a)

(b)

(a)

(b)

(a)

(b)

SEMICONDUCTOR MODULE AND MANUFACTURING METHOD THEREOF

TECHNICAL FIELD

The present invention relates to a semiconductor module and a manufacturing method thereof and more specifically to a semiconductor module having plural control terminals whose surface heights can equalized with high precision, and a manufacturing method therefor.

BACKGROUND ART

Increased mounting density of semiconductor modules continues to advance, and improvements are demanded in terms of the bonding strength between external lead-out terminals of a package and a conductive-patterned insulating substrate on which the terminals are mounted, the reliability of the bonding, and the attachment precision of the terminals. Such a semiconductor module is structured to include a metal heat-dissipating substrate, the conductive-patterned insulating substrate mounted on the substrate, and semiconductor elements (semiconductor chips) and external lead-out terminals to configure a circuit, respectively are mounted on the insulating substrate.

Another semiconductor module has been developed to facilitate cost reductions, and is configured to include main circuit terminals (hereinafter, simply referred to as "main terminals") and control terminals that are the external lead-out terminals, disposed as independent terminals not insert-fixed into a resin case (but outsert-fixed).

The control terminals include a gate terminal to input a gate signal; a protection and detection terminal to input and output a protection and detection signal; an emitter auxiliary terminal and an collector auxiliary terminal to be connected to the main terminals for the flow of main circuit current; etc.

FIG. 15 is a schematic diagram of a conventional semiconductor module having independent terminals. In FIG. 15, (a) is a plan view of primary components; and (b) is a cross-sectional diagram of the primary components of FIG. 15, as viewed in the direction indicated by an arrow P. In FIG. 15, the semiconductor module 500 includes a metal heat-dissipating substrate 51; a conductive-patterned insulating substrate 52 that is soldered onto the metal heat-dissipating substrate 51; main terminals 54 and control terminals 55 that are independent terminals, and semiconductor chips not depicted, respectively bonded by solder 53 to the conductive-patterned insulating substrate 52; a resin body 56 having metal nuts embedded therein to connect external lines to the main terminals 54 (generally referred to as "nut glove" and hereinafter, simply referred to as "resin body"); a resin case 58 that fixes the resin body 56; and a gel 59 that fills up the inside of the resin case 58.

An end of each of the control terminals 55 is fixed by solder 53 and the other end thereof protrudes from an opening 61 formed on the resin case 58. Each of the control terminals 55 is a straight-line independent terminal and connection thereof to an external line 62 is executed using a socket 63, etc. A reference numeral "60" in FIG. 15 denotes openings through which the main terminals 54 are exposed.

FIG. 16 is a diagram of a configuration of the resin body disposed beneath the main terminal soldered onto the conductive-patterned insulating substrate. In FIG. 16, the main terminal 54 is an independent terminal having a two-footing structure and two footing portions 64 thereof are fixed to the conductive-patterned insulating substrate 52 by the solder 53. The connection of the main terminal 54 to an external line (not depicted) is executed by attaching a bolt (not depicted) to a nut 65 embedded in the resin body 56.

Patent Document 1 describes a technique according to which, in a semiconductor apparatus fabricated by insert-forming terminal frames, which include main terminals and control terminals, to be integrated with a resin case and soldering the integrated component to a circuit assembly mounted on a metal base board: a shoulder portion, a leg portion, and a holding strip with a hole are disposed on each of the terminal frames as positioning supporting portions to support the terminal frame at a predetermined insertion position in the state where the terminal frame is set in a metallic mold for molding the resin case; the shoulder portion and the leg portion are sandwiched and held between the upper half of the mold and the lower half of the mold in a state where the terminal frame is set in the metallic mold; and the terminal frame is held at the predetermined insertion position by fitting an insertion pin of the metallic mold with the holding strip. Patent Document 1 further describes that, thereby, when the terminal-integrated resin case is formed, the terminal frame is set in the metallic mold and is stably held, whereby improvement of the precision of the position of the terminal is facilitated.

Patent Document 2 describes a technique according to which, a case having a tube-like shape with both ends thereof opened, and a protruding portion provided at an upper end of the case and protruding toward the inner face of the case are disposed; a board-shaped terminal electrically connecting circuit parts such as a semiconductor chip mounted on an upper main face of a conductive-patterned insulating substrate to an external apparatus, includes a right-angled U-shaped, folded fitting portion in the upper portion thereof; the folded fitting portion is fitted with the protruding portion of the case from the inner face of the case; and, thereby, the board-shaped terminal is attached to the case.

The board-shaped terminal of the technique of Patent Document 2 is fixed to the case by screws and the pivoting of the board-shaped terminal is controlled by a stopper that is a small protrusion disposed on a bottom face of the protruding portion of the case. The board-shaped terminal of the technique of Patent Document 2 is attached by fitting to the case and, thereby, processing of the board-shaped terminal as a single component to a predetermined shape is enabled. It is described that: thereby, according to the technique of Patent Document 2, the processing precision can be improved and the manufacture of the apparatus can be facilitated; whereby, the processing precision of the board-shaped terminal can be improved and the manufacturing process steps can be reduced.

Patent Document 1: Japanese Laid-Open Patent Publication No. H9-321217

Patent Document 2: Japanese Laid-Open Patent Publication No. H7-66340

DISCLOSURE OF INVENTION

Problem to be solved by the Invention

For the semiconductor module 500 depicted in FIG. 15 and including the main terminals 54 and the control terminals 55 that are the independent terminals, a use is present to dispose a printed circuit board having a control circuit formed thereon, on the control terminals 55. To cope with this use, it is necessary to change the surface structure of each of the control terminals 55 to a flat face such that the printed circuit board can be placed on the control terminals 55. It is demanded that the heights of the surfaces of the control terminals 55 are equalized with high precision to use a robot for the manufacture. The control terminals 55 each need to have an independent-terminal structure, not an insert-structure, to reduce the cost of the semiconductor module 500.

However, though a semiconductor apparatus of these inventions satisfies the above demands, a problem arises in that Patent Documents 1 and 2 do not take into consideration the highly precise equalization of the heights of the surfaces of the control terminals that are the independent terminals.

To solve the above problems related to the conventional techniques, the object of the present invention is to provide a semiconductor module having control terminals disposed as independent terminals whose surface heights can be equalized with high precision, and a manufacturing method thereof.

Means for Solving Problem

To solve the problems above and achieve an object, a semiconductor module includes a metal heat-dissipating substrate; a conductive-patterned insulating substrate that is bonded onto the metal heat-dissipating substrate; a semiconductor chip that is bonded onto the conductive-patterned insulating substrate; main circuit terminals and control terminals that are bonded by solder onto the conductive-patterned insulating substrate; a resin case that is bonded to the metal heat-dissipating substrate, the resin case having a first opening through which at least any one among surfaces of the main circuit terminals and surfaces of the control terminals are exposed; a resin body that is inserted into and attached to a second opening formed on a side wall constituting the resin case, the resin body having a nut embedded therein to fix at least any one among the main circuit terminals and the control terminals; and a resin material that fills up the resin case. The first opening includes a tapered side wall that is narrowed toward the surface, and the control terminals each include a tapered contact portion that is in contact with the tapered side wall of the first opening when the control terminals are each exposed from the first opening.

Further, in the semiconductor module above, the resin body having the nut embedded therein to fix the control terminal has a fine protrusion that is disposed on a surface of the resin body at a point closer to an outer perimeter than to an opening of the nut embedded in the resin body and that protrudes upward when the resin body is inserted and attached beneath the control terminal.

Further, in the semiconductor module above, the resin body having the nut embedded therein to fix the control terminal has a protruded portion disposed on a lower side of the resin body and protruding toward a head of the resin body in a direction for the resin body to be inserted into and attached to the second opening.

Further, a manufacturing method of a semiconductor module includes soldering a metal heat-dissipating substrate with a conductive-patterned insulating substrate, and the conductive-patterned insulating substrate with semiconductor chips, in a soldering furnace filled with a hydrogen atmosphere; soldering main circuit terminals and control terminals onto the conductive-patterned insulating substrate using a predetermined fabrication jig; covering with a resin case, the conductive-patterned insulating substrate having the main circuit terminals and the control terminals soldered thereon, the conductive-patterned insulating substrate being covered with the resin case from above such that upper portions of at least the main circuit terminals or the control terminals are exposed from a first opening that opens upward, and bonding a perimeter of a lower portion of the resin case to the metal heat-dissipating substrate; and fixing at least any one among the main circuit terminals and the control terminals via a resin body by inserting and attaching from a second opening and beneath at least any one among the main circuit terminals and the control terminal, the resin body having a nut embedded therein, thereby placing the resin body on a footing formed inside the resin case.

Further, in the manufacturing method of the semiconductor module, the first opening has a tapered side wall whose portion on the side of the surface is narrowed, and the control terminal has a tapered contact portion that is in contact with the tapered side wall of the first opening when the control terminal is exposed from the first opening by covering the conductive-patterned insulating substrate with the resin case from above.

Further, in the manufacturing method of the semiconductor module, the resin body having the nut embedded therein to fix the control terminal has a fine protrusion, disposed on a surface of the resin body at a point closer to an outer perimeter than to an opening of the nut embedded in the resin body, and protruding upward when the resin body is inserted and attached beneath the control terminal, and the fixing includes fixing the control terminal by causing the fine protrusion to abut against the control terminal when the resin body is inserted and attached beneath the control terminal.

Further, in the manufacturing method of the semiconductor module, the resin body having the nut embedded therein to fix the control terminal has a protruded portion disposed on a lower side of the resin body and protruding toward a head of the resin body in a direction for the resin body to be inserted into and attached to the second opening.

Effect of the Invention

According to the present invention, the surface heights of the terminals can be equalized with high precision by fixing each of the control terminals disposed as independent terminals each having a one-footing structure, using a resin body having a nut embedded therein.

According to the present invention, the surface heights of the terminals can be further equalized with higher precision by disposing fine protrusions on the surface of the resin body.

BEST MODE(S) FOR CARRYING OUT THE INVENTION

Preferred embodiments of a semiconductor module and a manufacturing method of the semiconductor module will be described in detail with reference to the accompanying drawings.

(First Embodiment)

Figure 1:
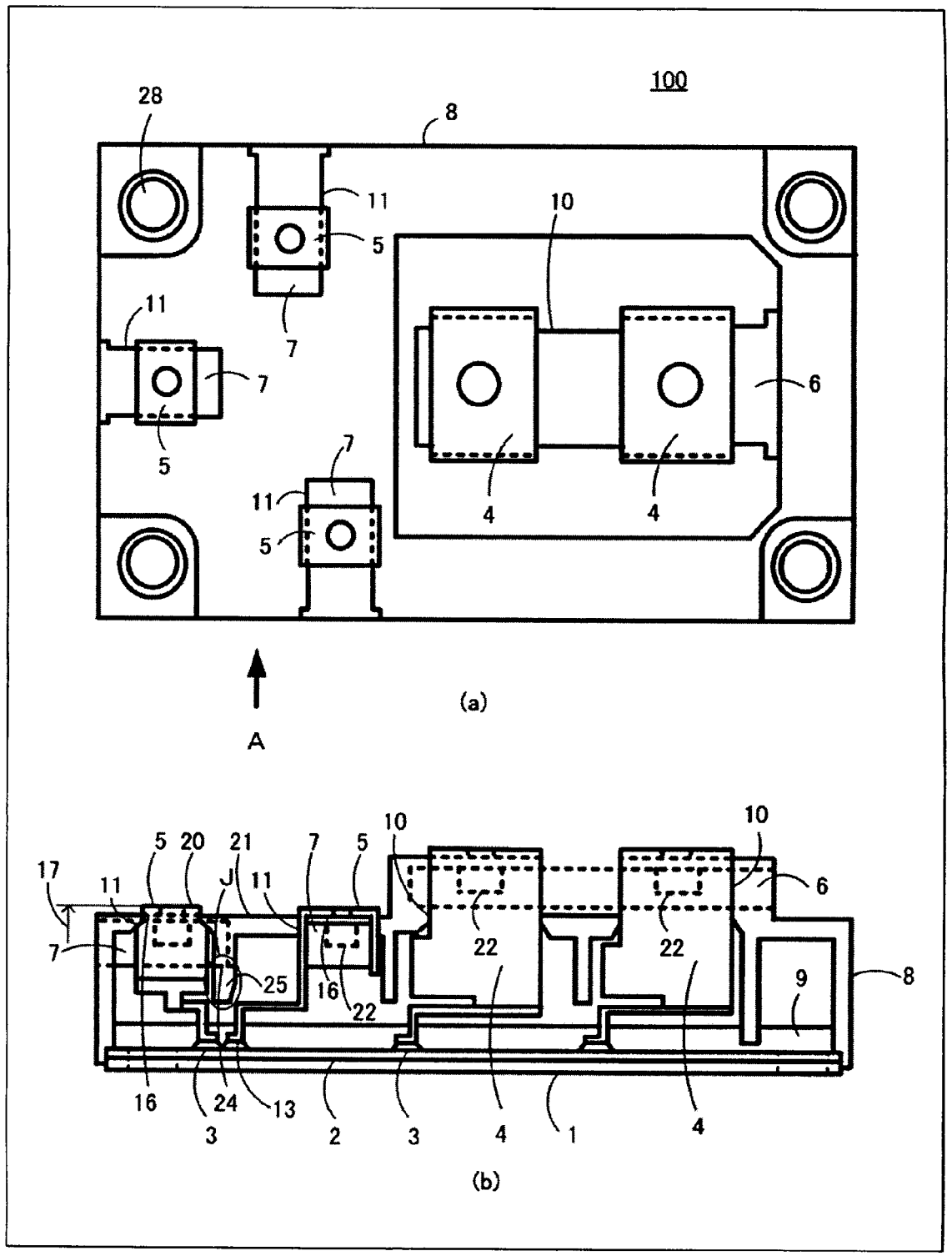
FIG. 1 is a configuration diagram of a semiconductor module of a first embodiment of the present invention, where (a) is a plan view of primary components; and (b) is a cross-sectional diagram of the primary components as viewed in the direction indicated by an arrow A in (a)
Figure 2:
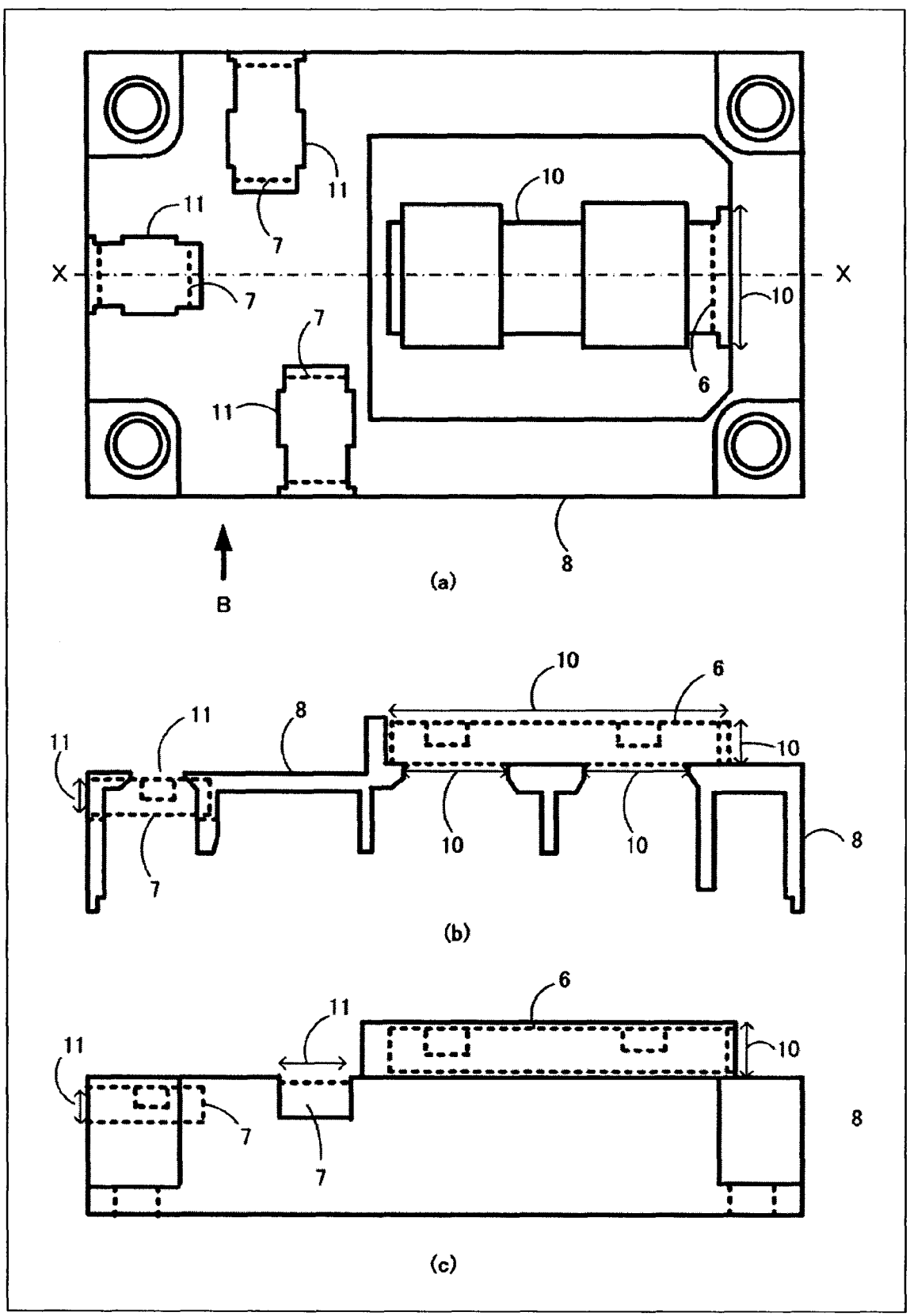
FIG. 2 is a configuration diagram of a resin case depicted in FIG. 1, where (a) is a plan view of primary components; (b) is a cross-sectional diagram of the primary components, cut along an X-X line; and (c) is a side view of the primary components as viewed in the direction indicated by an arrow B in (a)

A first embodiment of the present invention will be described. A semiconductor module according to the present invention will be described in the first embodiment. FIG. 1 is a configuration diagram of the semiconductor module of the first embodiment of the present invention. In FIG. 1, (a) is a plan view of primary components; and (b) is a cross-sectional diagram of the primary components as viewed in the direction indicated by an arrow A of (a) in FIG. 1. FIG. 2 is a configuration diagram of a resin case depicted in FIG. 1. In FIG. 2, (a) is a plan view of primary components; (b) is a cross-sectional diagram of the primary components, cut along an X-X line; and (c) is a side view of the primary components as viewed in the direction indicated by an arrow B of (a) in FIG. 2.

Figure 3:
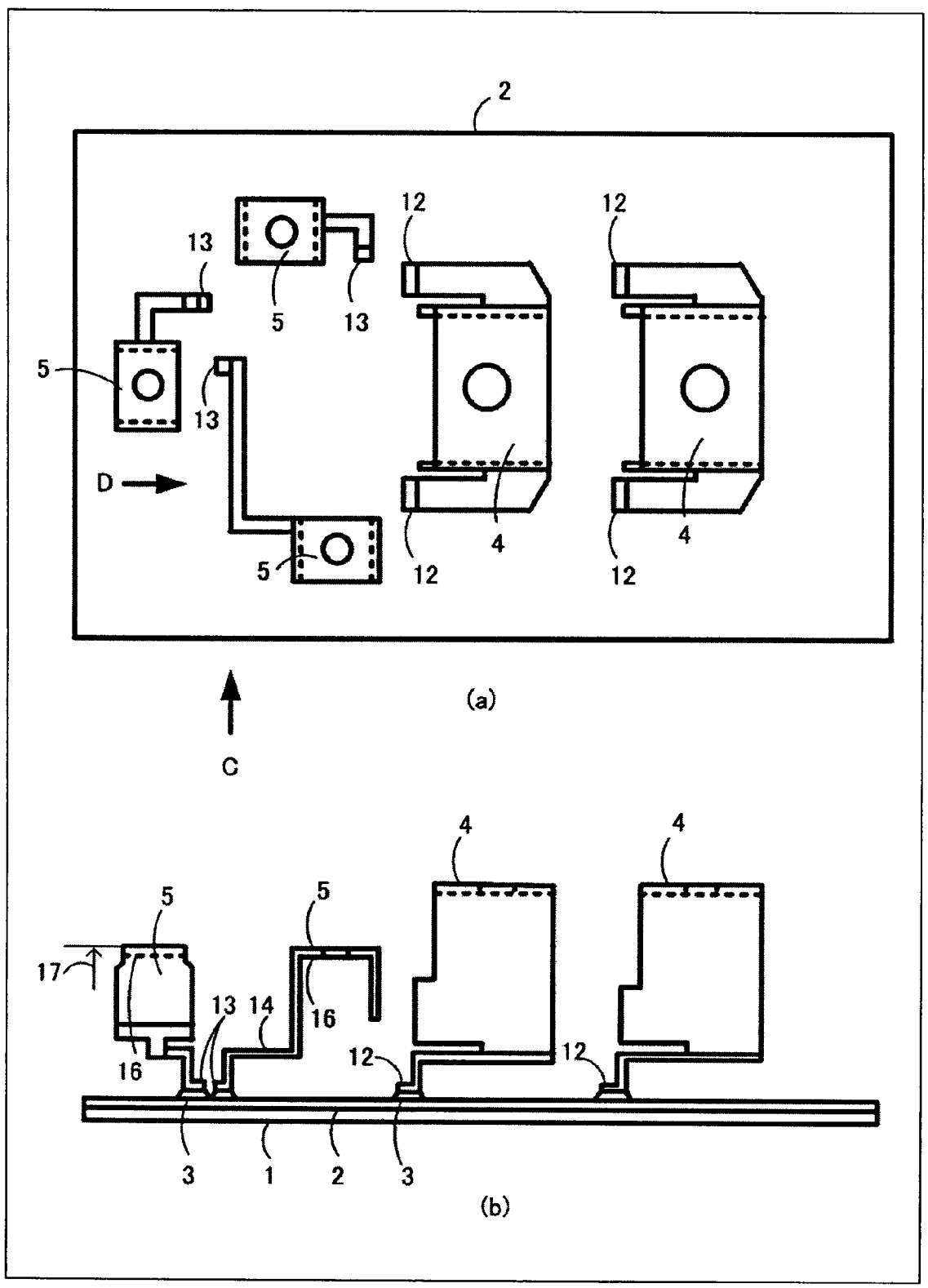
FIG. 3 is a configuration diagram of main terminals and control terminals soldered onto a conductive-patterned insulating substrate depicted in FIG. 1, where (a) is a plan view of primary components; and (b) is a cross-sectional diagram of the primary components as viewed in the direction indicated by an arrow C in (a)
Figure 4:
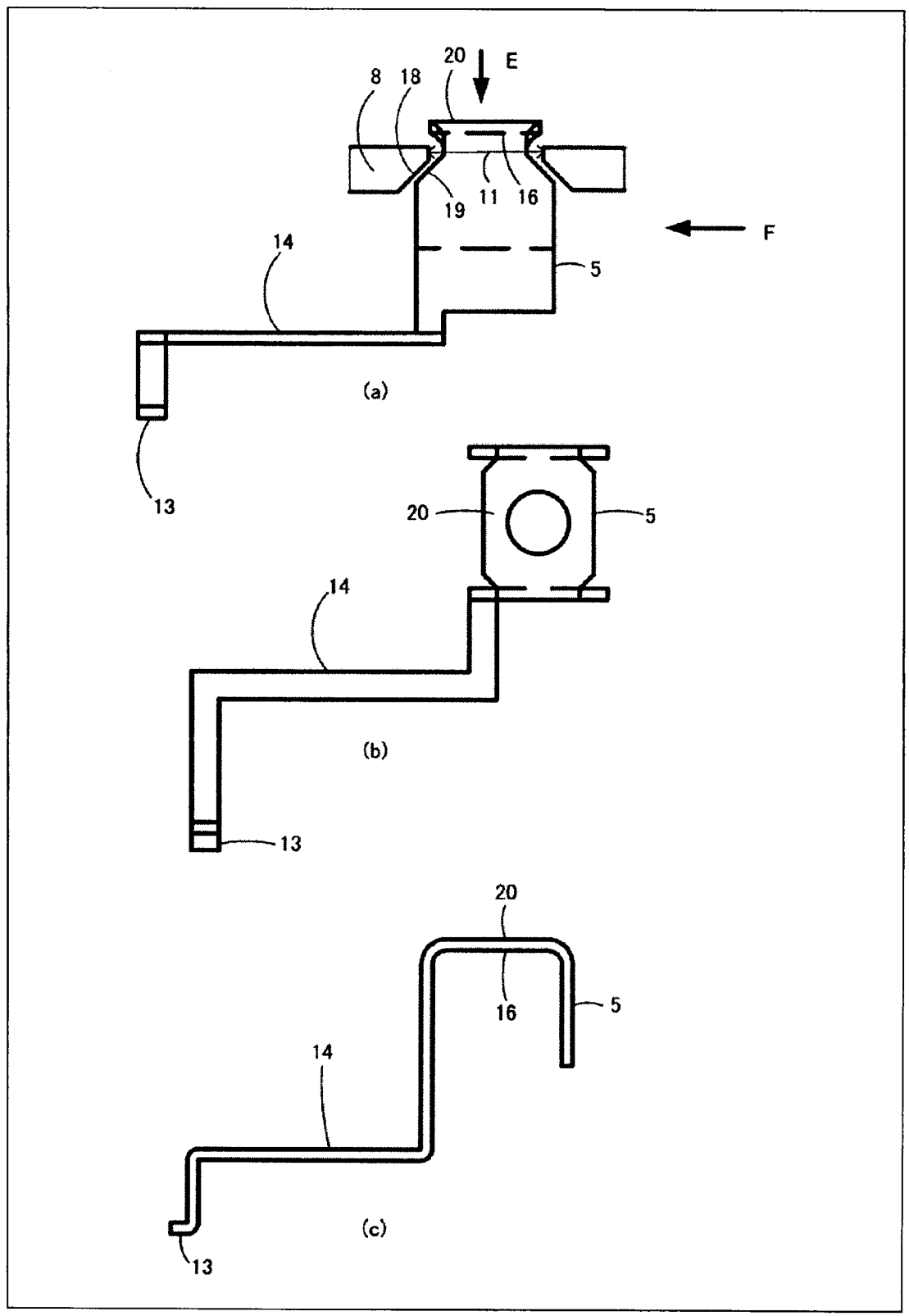
FIG. 4 is a configuration diagram of the control terminal depicted in FIG. 3, where (a) is a diagram of the control terminal as viewed in the direction indicated by an arrow D in (a); (b) is a diagram of the control terminal as viewed in the direction indicated by an arrow E in (a); and (c) is a diagram of the control terminal as viewed in the direction indicated by an arrow F in (a)

FIG. 3 is a configuration diagram of main terminals and control terminals soldered onto a conductive-patterned insulating substrate depicted in FIG. 1. In FIG. 3, (a) is a plan view of primary components; and (b) is a cross-sectional diagram of the primary components as viewed in the direction indicated by an arrow C of (a) in FIG. 3. FIG. 4 is a configuration diagram of the control terminal depicted in FIG. 3. In FIG. 4, (a) is a diagram of the control terminal as viewed in the direction indicated by an arrow D of FIG. 3; (b) is a diagram of the control terminal as viewed in the direction indicated by an arrow E of (a) in FIG. 4; and (c) is a diagram of the control terminal as viewed in the direction indicated by an arrow F of (a) in FIG. 4.

Figure 5:
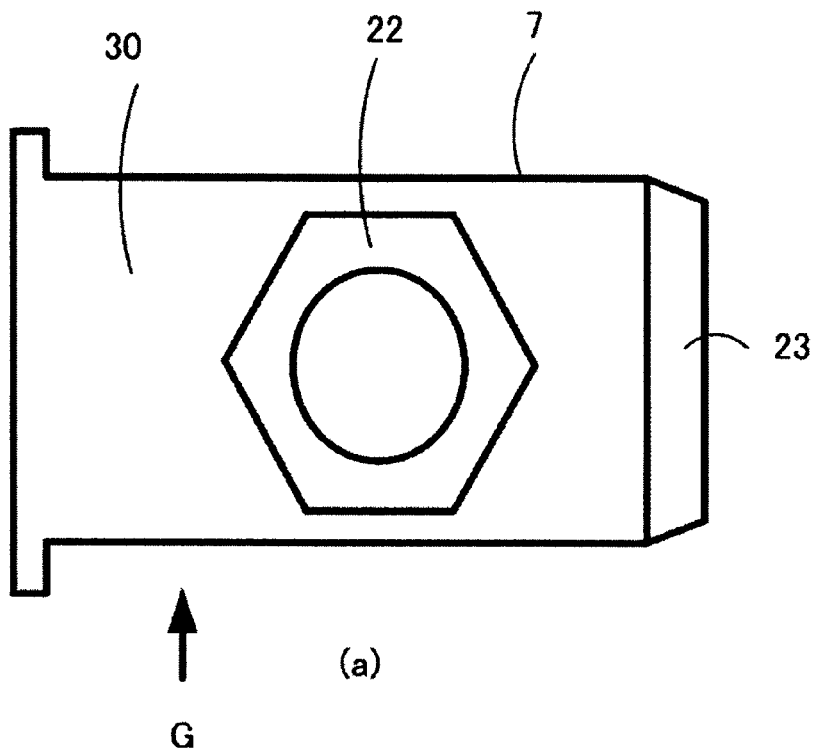
FIG. 5 is a configuration diagram of a resin body (commonly referred to as "nut glove") depicted in FIG. 1, where (a) is a plan view of primary components; and (b) is a side view of the primary components as viewed in the direction indicated by an arrow G in (a)
Figure 5:
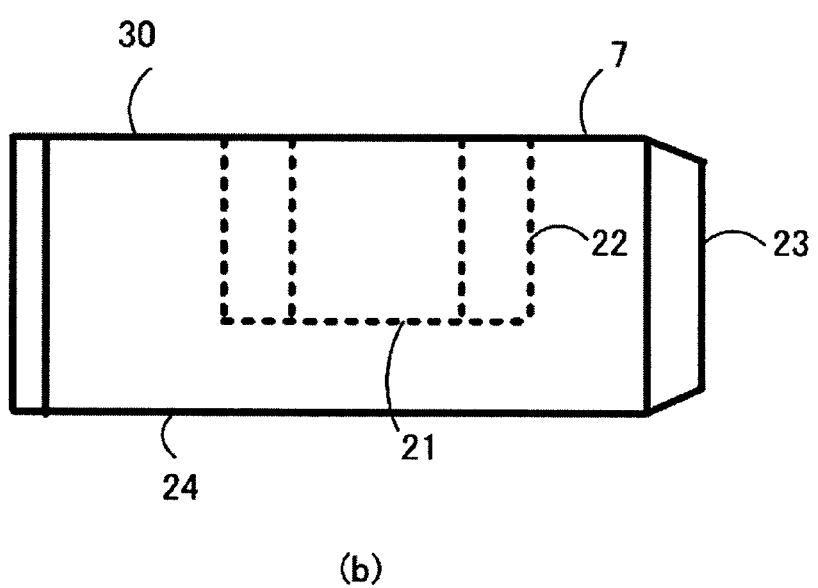
Figure 6:
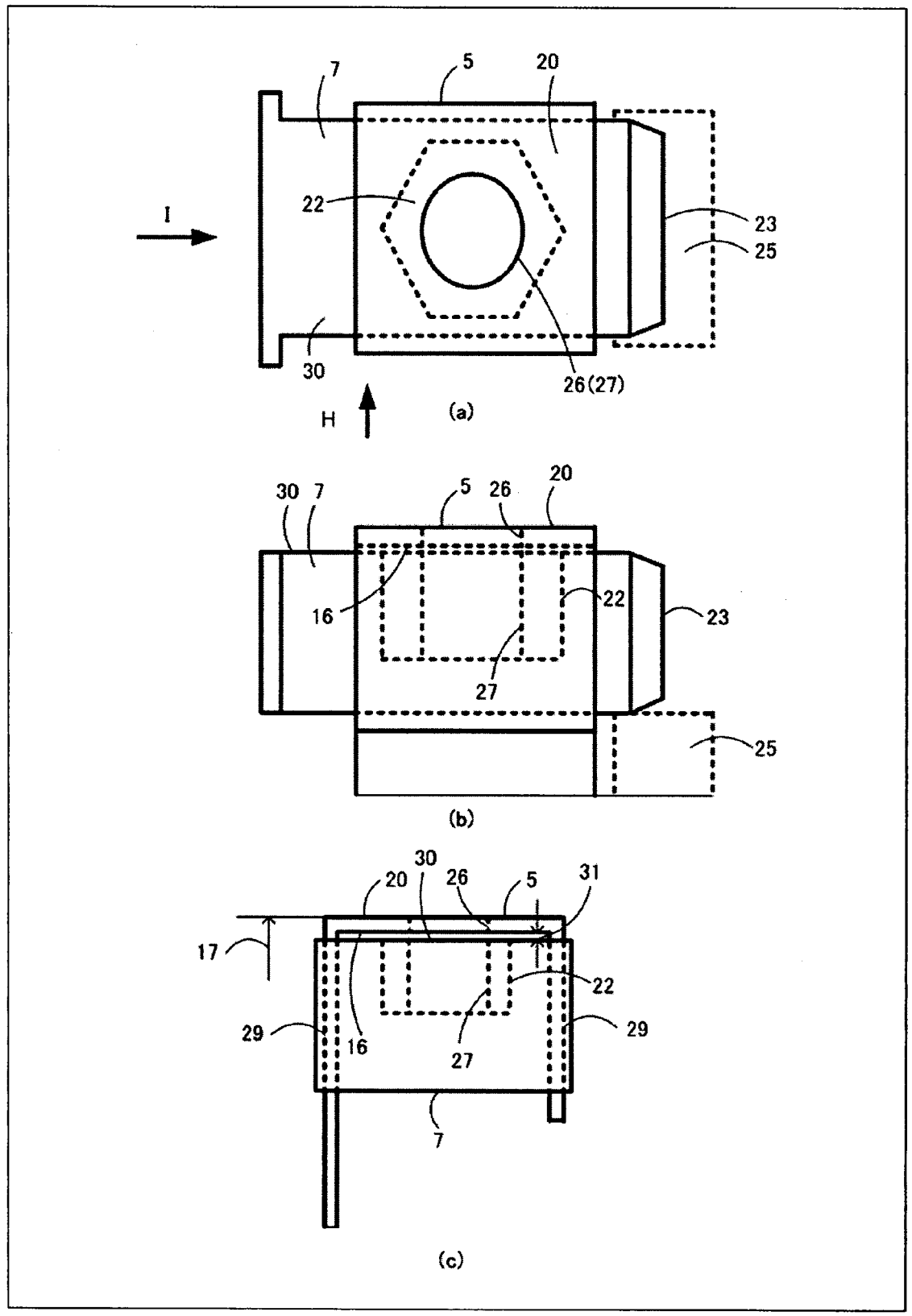
FIG. 6 is a diagram of disposition of the resin body depicted in FIG. 5 under the control terminal, where (a) is a plan view of primary components; (b) is a diagram of the primary components are viewed in the direction of an arrow H in (a); and (c) is a diagram of the primary components are viewed in the direction of an arrow I in (a)

FIG. 5 is a configuration diagram of a resin body (commonly referred to as "nut glove") depicted in FIG. 1. In FIG. 5, (a) is a plan view of primary components; and (b) is a side view of the primary components as viewed in the direction indicated by an arrow G of (a) in FIG. 5. FIG. 6 is a diagram of disposition of the resin body depicted in FIG. 5 under the control terminal. In FIG. 6, (a) is a plan view of primary components; (b) is a diagram of the primary components are viewed in the direction of an arrow H of (a) in FIG. 6; and (c) is a diagram of the primary components are viewed in the direction of an arrow I of (a) in FIG. 6.

In FIGS. 1, 2, 3, 4, 5, and 6, a semiconductor module 100 includes a metal heat-dissipating substrate 1 (heat-dissipating base), a conductive-patterned insulating substrate 2 bonded by solder (not depicted) onto the metal heat-dissipating substrate (metal heat-dissipating substrate) 1; main terminals (main circuit terminals) 4, control terminals 5, and semiconductor chips (not depicted) that are bonded by solder 3 onto the conductive-patterned insulating substrate 2; bonding wires (not depicted) that connect the semiconductor chips and that connect the semiconductor chips and the conductive-patterned insulating substrate; resin bodies 6 and 7 that fix the main terminals 4 and the control terminals 5 and that are used to connect external lines (not depicted) thereto; and a resin case 8 that fixes the resin bodies 6 and 7. A gel 9 is disposed in the resin case 8. A reference numeral "28" in FIGS. 1 to 6 denotes attachment holes to attach the metal heat-dissipating substrate 1 to a cooling fin not depicted.

Openings 10 and 11 are disposed on the resin case 8. The openings 10 and 11 are each formed spanning continuously from a side face of the resin case 8 to an upper face that connected to the side face of the resin case 8. The openings 10 and 11 are each configured by a first opening formed on the surface of the resin case 8 and a second opening that is connected to the first opening and that is formed on the side wall of the resin case 8. In the first embodiment, the first opening and the second opening are realized by the openings 10 and 11 each formed as one opening. The main terminals 4 and the control terminals 5 are exposed from the openings 10 and 11. The resin bodies 6 and 7 are inserted into and attached to the openings 10 and 11 of the resin case 8, and fix the main terminals 4 and the control terminals 5.

As depicted in FIG. 3, each of the main terminals 4 is thick and wide and, therefore, has high rigidity, and both of leg portions 12 of each two-footing structure thereof are fixed by solder and, therefore, the main terminal 4 is not deformable. The main terminal 4 is connected to an external line not depicted. The main terminal 4 and the external line connected to the main terminal 4 are fixed to each other by attaching a bolt (not depicted) to a nut 22 (see FIG. 1) embedded in the resin body 6. In this manner, the resin body 6 disposed beneath the main terminals 4 acts more to connect the external lines to the main terminals 4 than to fix the main terminals 4.

Each of the control terminals 5 has a one-footing structure and includes a footing 14. Of the footing 14 of the control terminal 5 having the one-footing structure, a single-leg portion 13 is fixed by solder 3. Because the single-leg portion 13 is fixed by the solder 3, when the width of the footing 14 is decreased and the length thereof is increased, the rigidity of the footing 14 becomes low and the footing 14 becomes deformable, whereby the surface of each of the control terminals 5 tends to be misaligned upward or downward and to the right or left. In the semiconductor module 100 of the first embodiment, as depicted in FIG. 1, the control terminals 5 are firmly fixed by disposing the resin body 7 on lower faces 16 of the control terminals 5. In this manner, disposing the resin body 7 on the lower faces 16 of the control terminals 5 enables secure fixing of the control terminals 5 to the resin case 8.

In FIG. 1, (b) does not depict the control terminals 5 disposed in the deeper side from the page surface. FIG. 2 depicts, for reference, the resin body 6 having the nuts 22 embedded therein. FIG. 3 does not depict the conductive patterns and the attachment holds of the conductive-patterned insulating substrate. In FIG. 3, (b) does not depict the control terminals disposed in the deeper side from the page surface. In FIG. 4,(a) depicts a portion around the opening of the resin case 8.

The surface heights 17 of the plural control terminals 5 can be equalized with high precision. The external lines (not depicted) connected to the control terminals 5 are fixed to the control terminals 5 by attaching bolts (not depicted) to the nuts 22 embedded in the resin body 7. The resin body 7 disposed beneath the control terminals 5 acts for three functions including fixing the control terminals 5, precisely equalizing the surface heights 17 of the control terminals 5, and connecting the external lines and the control terminals 5. Known methods such as a method of embedding the nuts 22 in the resin body 7, can be used as a method of integrally casting the nuts 22 in the resin body 7, and a method of forming recesses to be fitted with the nuts 22 in the resin body 7 and fitting the nuts 22 in the recesses.

As depicted in FIG. 4, a side wall 18 of each of the openings 11 of the resin case 8 has a tapered shape that is wide inside the resin case 8 and that becomes narrower toward the surface thereof. The opening 11 can realize the first opening formed on the surface of the resin case 8. A contact portion 19 of the control terminal 5 in contact with the tapered side wall 18 is formed in a tapered shape to match (fit) with the above tapered shape.

The side wall 18 of the opening 11 and the contract portion 19 of the control terminal 5 are configured to be in contact with each other in their tapered portions. The side wall 18 of the opening 11 and the contact portion 19 of the control terminal 5 are shaped in the tapered shapes and thereby, for example, when the control terminal 5 inclines and is in contact with the tapered portion on one side, both of the tapered portions are in contact with each other in the course of the insertion and the attachment of the resin body 7. The contact portion 19 is accommodated in the side wall 18 and the both of the tapered portions are in contact with each other and thereby, a surface 20 of the control terminal 5 becomes parallel to the surface of the resin case 8 and thereby, the surface heights 17 of the control terminals 5 can be equalized with high precision.

The shape of the side wall 18 only has to become wider toward the interior from the exterior and only has to be a tapered shape to accommodate the contact portion 19. The side wall 18 may be shaped in a tapered shape for the entire width thereof. A recess may be formed in a portion of the side wall 18 and the interior of the recess may be formed in a tapered shape to accommodate the contact portion 19. Any among a linear taper and a conical taper may be used.

The control terminal 5 has been described for that having the one-footing structure. However, even when the control terminal 5 has the two-footing structure with which the control terminal 5 has a low thickness, a small width, and low rigidity, and is deformable, the same effect can be achieved by disposing the resin body 7 beneath the control terminal 5. However, the outer size of the semiconductor module 100 becomes large because the space to solder the control terminal 5 is expanded.

As depicted in FIG. 5, the resin body 7 disposed beneath the control terminal 5 is formed by forming a recess 21 on a resin cuboid and embedding the metal nut 22 in the recess 21. The upper face, the lower face, and the side faces of the control terminal 5 are all flat. A tip 23 of the resin body 7 is tapered. The resin body 7 is inserted into and attached to the opening 11 formed on the side face of the resin case 8 from the tapered side.

As depicted in a J portion of FIG. 1, a bottom face 24 of the resin body 7 (see FIG. 5) is placed on a footing 25 formed inside the resin case 8 and thereby, a downward movement of the resin body 7 is blocked by the footing 25. The downward movement of the resin body 7 is blocked and thereby, a downward movement of each of the control terminals 5 is also blocked. An upward movement of the resin body 7 is blocked because the single-leg portion 13 of the control terminal 5 is bonded by the solder 3 onto the conductive-patterned insulating substrate 2.

As depicted in FIG. 6, the resin body 7 is disposed on the lower face 16 of the control terminal 5 and thereby, the surface heights 17 of the control terminals 5 are equalized with high precision. The external lines connected to the control terminals 5 and the main terminals 4 are fixed thereto by attaching bolts to the nuts 22 embedded in the resin bodies 7 and 6. "26" of FIG. 6 denotes an attachment hole formed on the control terminal 5 to insert and attach the bolt not depicted into/to. "27" of FIG. 6 denotes a threaded hole formed in the nut 22 of the resin body 7 to insert and attach the bolt (not depicted).

(Second Embodiment)

Figure 7:
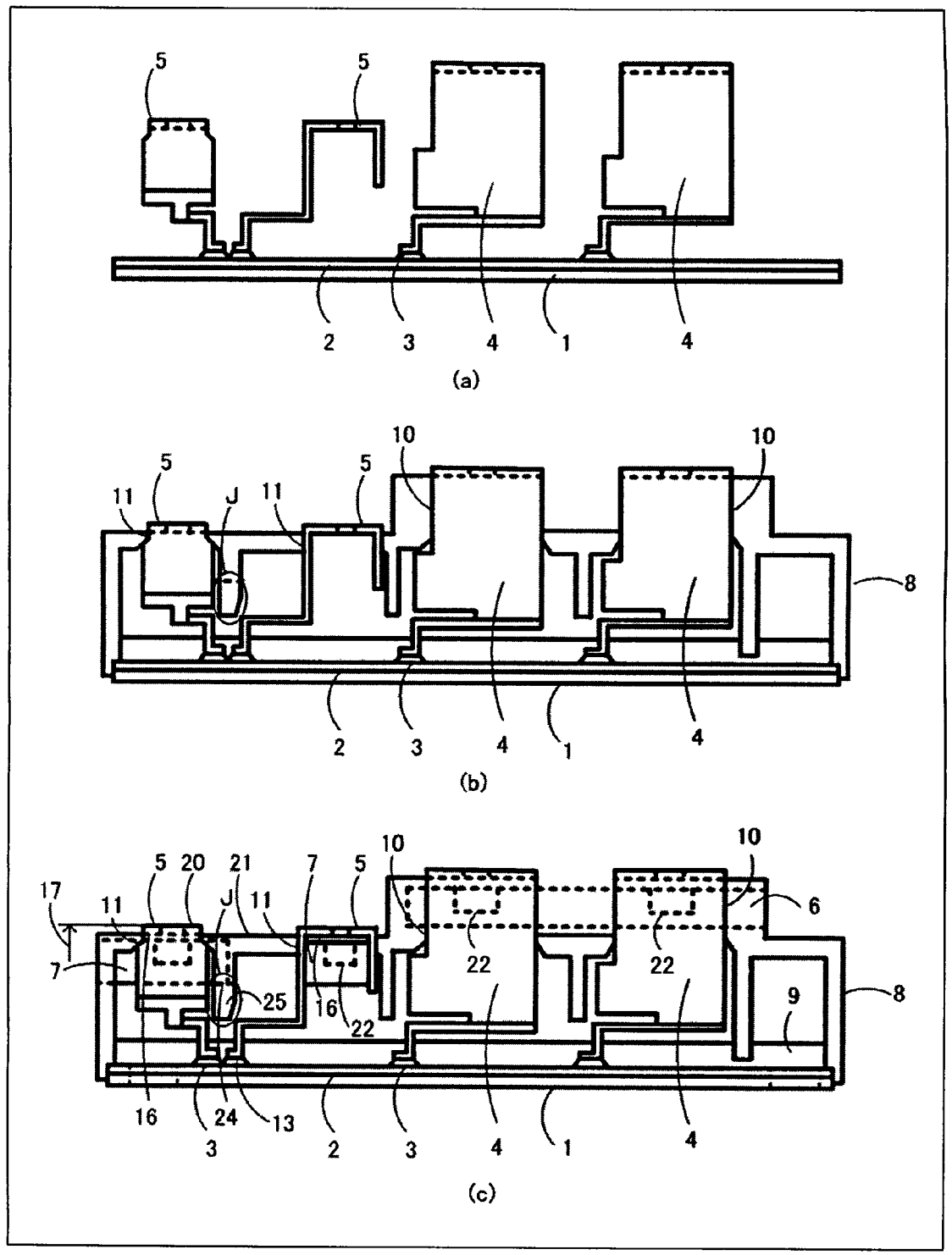
FIG. 7 depicts a manufacturing method of the semiconductor module of a second embodiment of the present invention and (a) to (c) of FIG. 7 are cross-sectional diagrams of manufacturing process steps of the primary components depicted in order of process steps.

A second embodiment of the present invention will be described. A manufacturing method of the semiconductor module 100 of the first embodiment will be described in the second embodiment. FIG. 7 depicts the manufacturing method of the semiconductor module of the second embodiment of the present invention and (a) to (c) of FIG. 7 are cross-sectional diagrams of manufacturing process steps of the primary components depicted in order of the process steps.

As depicted in (a) of FIG. 7, for manufacturing the semiconductor module 100, soldering is executed between the metal heat-dissipating substrate 1 and the conductive-patterned insulating substrate 2 and between the conductive-patterned insulating substrate 2 and the semiconductor chips not depicted, in a soldering furnace filled with a hydrogen atmosphere. Connection is executed using bonding wires (not depicted) between the semiconductor chips and between the semiconductor chips and the conductive patterns (not depicted) of the conductive-patterned insulating substrate 2. The main terminals 4 and the control terminals 5 are soldered onto the conductive-patterned insulating substrate 2. The main terminals 4 and the control terminals 5 can be soldered onto the conductive-patterned insulating substrate 2 using a fabrication jig depicted in FIG. 9.

As depicted in (b) of FIG. 7, the metal heat-dissipating substrate 1 is covered by the resin case 8 from above such that upper portions of the main terminals 4 and the control terminals 5 are exposed from the openings 10 and 11 opening in the upper portion of the resin case 8, and the lower perimeter inside the outer wall of the resin case 8 is bonded to the metal heat-dissipating substrate 1. Thereafter, the inside of the resin case 8 is filled up with the gel 9.

As depicted in (c) of FIG. 7, the resin bodies 6 and 7 (the nut gloves) having the nuts disposed therein are inserted and attached respectively beneath the main terminals 4 and the control terminals 5, from the openings 10 and 11 (the second openings) on the side faces of the resin case 8. When the resin bodies 6 and 7 are placed on the footings 25 of the resin case 8 with the lower faces of the resin bodies 6 and 7 in contact with the footings 25, the main terminals 4 and the control terminals 5 are fixed by the resin bodies 6 and 7. The same manufacturing method can be employed even when the resin body 7 is replaced with a resin body 40 described later with reference to FIGS. 11 and 12.

Figure 8:
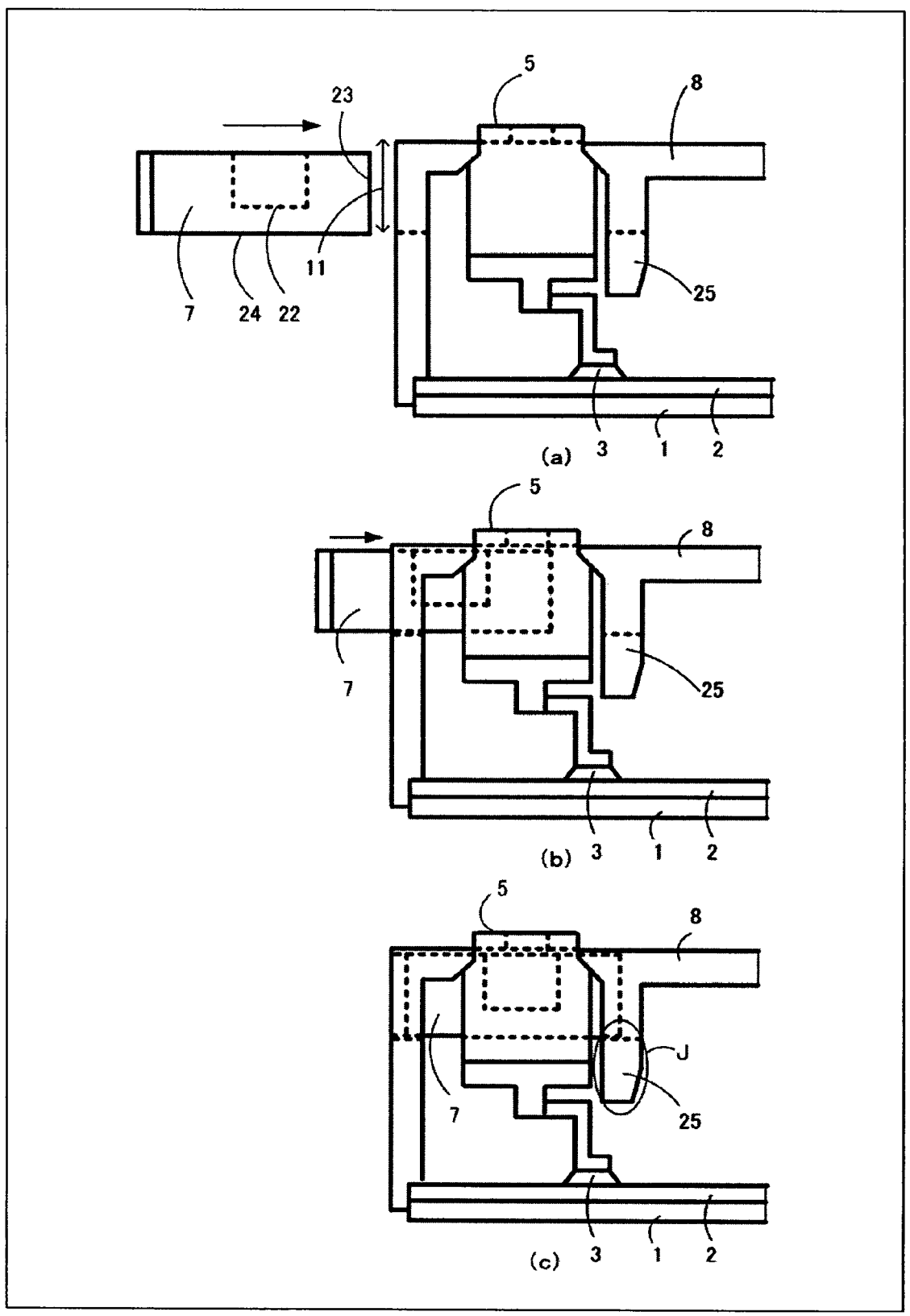
FIG. 8 is a diagram of a state where the resin body is inserted into and attached to the resin case.

FIG. 8 is a diagram of a state where the resin body is inserted into and attached to the resin case. In FIG. 8, (a) is a diagram of the state before the insertion and attachment; (b) is a diagram of the state during the insertion and the attachment; and (c) is a diagram of the state after the insertion and the attachment. In FIG. 8, when the resin body 7 is inserted into and attached to the resin case 8, the tip 23 of the resin body 7 is positioned in the opening 11 (the second opening) on the side face of the resin case 8 (see (a) of FIG. 8).

The bottom face 24 of the resin body 7 is positioned on the lower faces 16 of the control terminals 5, kept in contact with the opening 11 on the side wall of the resin case 8 (see (b) of FIG. 8). The resin body 7 is advanced into the resin case 8 and the tip 23 of the resin body 7 is placed on the footing 25 in the J portion formed in the resin case 8. Thereby, the resin body 7 is fixed to the resin case 8 and the control terminal 5 is fixed by the resin body 7 (see (c) of FIG. 8).

As depicted in (c) of FIG. 6, the control terminal 5 is configured in a U-shape by the surface 20 thereof and a face 29 that is perpendicular to this surface. The resin body 7 is disposed on the U-shaped portion and thus, even when the control terminal 5 inclines, the control terminal 5 can be returned to the normal position thereof by advancing the resin body 7 into the resin case 8 in the process step depicted in (c) of FIG. 8.

As described, the resin body 7 is inserted and attached beneath the control terminal 5 having the one-footing structure with which the control terminal 5 is movable upward or downward and to the right or left and thereby, a gap 31 between an upper face 30 of the resin body 7 and the lower face 16 of the control terminal 5 is narrowed. Thus, the surface heights 17 of the control terminals 5 each having the one-footing structure can be equalized with high precision.

Figure 9:
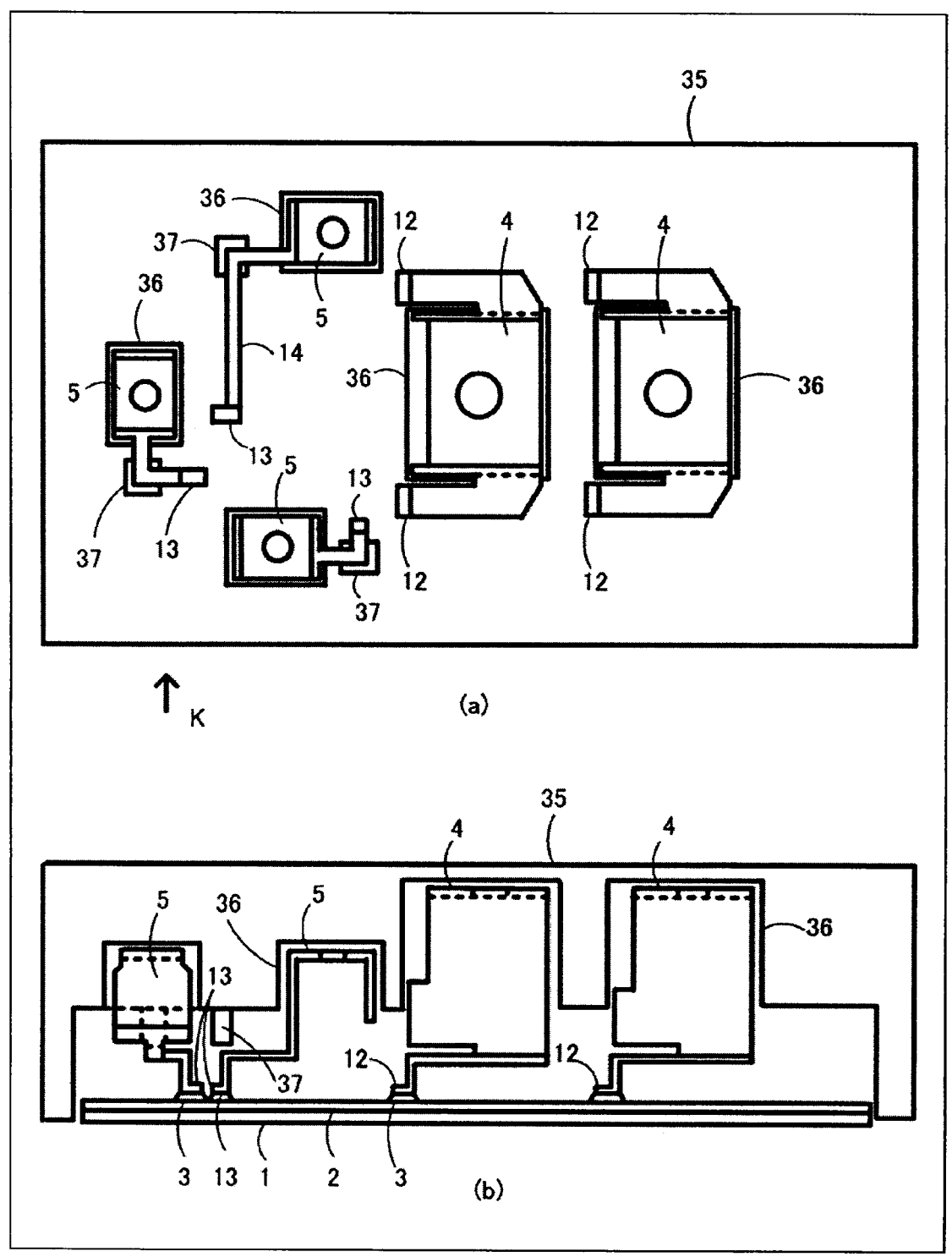
FIG. 9 is a configuration diagram of a fabrication jig for soldering, where (a) is a plan view of primary components; and (b) is a cross-sectional diagram of the primary components as viewed in the direction indicated by an arrow K in (a)

FIG. 9 is a configuration diagram of the fabrication jig for soldering. In FIG. 9, (a) is a plan view of primary components; and (b) is a cross-sectional diagram of the primary components as viewed in the direction indicated by an arrow K of (a) in FIG. 9. In FIG. 9, (a) is a plan view of a state where the upper portions (surfaces) of the main terminals 4 and the control terminals 5 are inserted into and attached to a recess 36 of a fabrication jig 35, and is a plan view of these terminals as viewed from the side of the two-leg portions 12 and the single-leg portions 13 to be soldered. The fabrication jig 35 is upside-down against that for the soldering. In FIG. 9, (b) is the cross-sectional diagram depicting a state where the two-leg portions 12 and the single-leg portions 13 to be soldered of (a) of FIG. 9 are oriented downward and are soldered onto the conductive-patterned insulating substrate 2.

The main terminals 4 and the control terminals 5 are positioned using the fabrication jig 35 and the soldering is executed. The use of the fabrication jig 35 enables bonding of the main terminals 4 and the control terminals 5 by the solder 3 to the predetermined positions thereof on the conductive-patterned insulating substrate 2. The main terminals 4 have high rigidity and the two-leg portions 12 thereof are fixed by the solder 3 and therefore, the main terminals 4 are not deformable. The precision of the surface heights of the main terminals 4 depends on the fabrication jig 35 used in the soldering step. The control terminals 5 are flexible and therefore, supporting bases 37 support the footings 14 to prevent deformation thereof during the soldering.

In the semiconductor module 100 of FIG. 1, the control terminals 5 are fixed using the resin body 7 and the gap 31 (see FIG. 6) between the upper face 30 of the resin body 7 and the lower faces 16 of the control terminals 5 is narrowed (for example, to about 0.2 mm). Thus, the surface heights 17 of the control terminals 5 each having the one-footing structure whose rigidity is low can be equalized with high precision within a range of ±0.25 mm or less.

Figure 10:
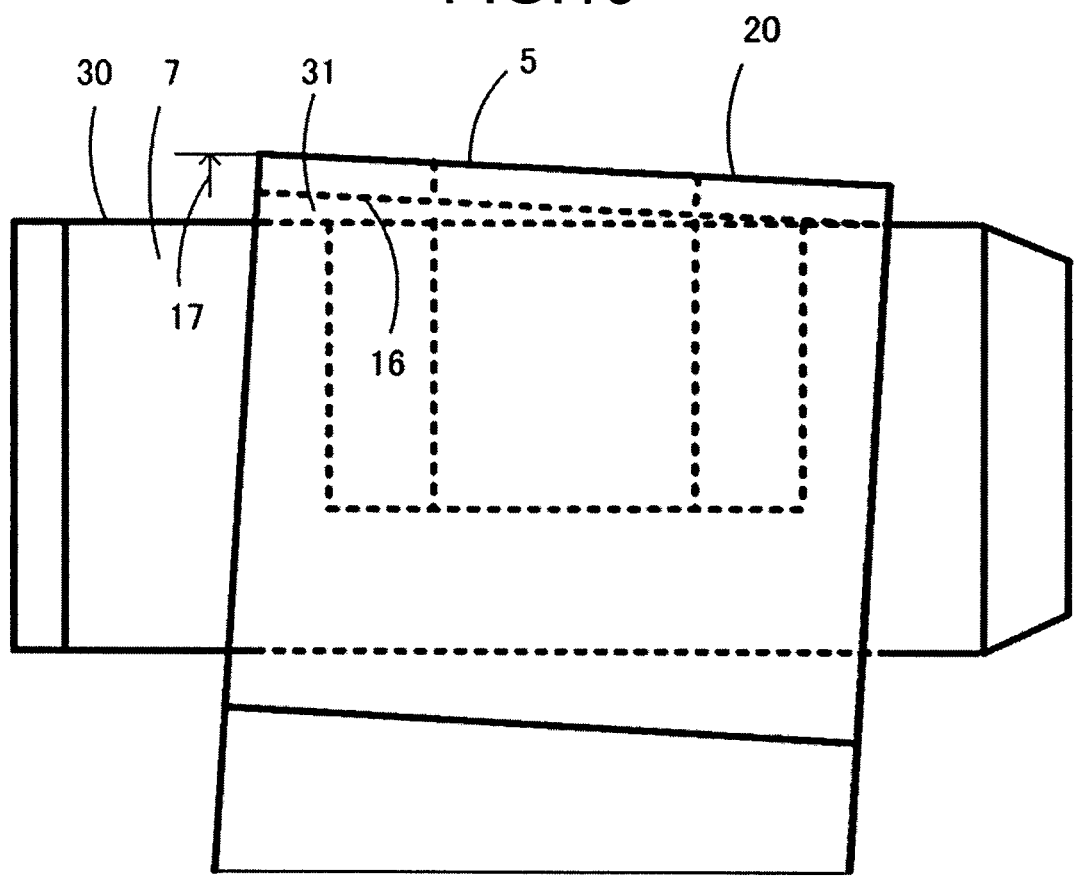
FIG. 10 is a cross-sectional diagram of a state where the control terminal inclines.

FIG. 10 is a cross-sectional diagram of a state where the control terminal inclines. As described, the gap 31 is present between the lower faces 16 of the control terminals 5 and the upper face 30 of the resin body 7 and therefore, the surfaces 20 of some of the control terminals 5 may incline and the surface heights 17 may not be equal. A semiconductor module having the control terminals 5 whose surface heights 17 can further equalized with higher precision will be described in a third embodiment below.

(Third Embodiment)

Figure 11:
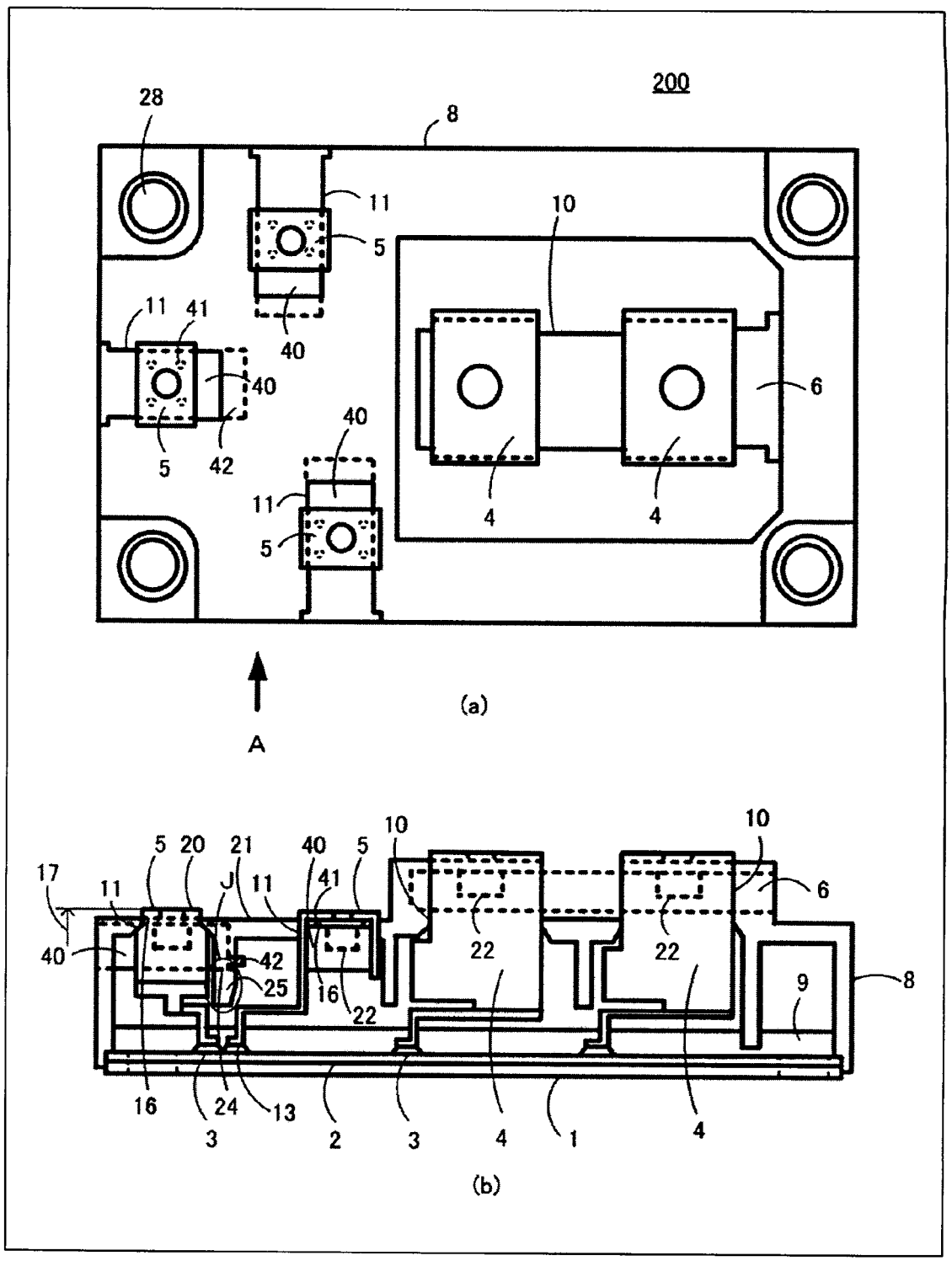
FIG. 11 is a configuration diagram of a semiconductor module of a third embodiment of the present invention, where (a) is a plan view of primary components; and (b) is a cross-sectional diagram of the primary components as viewed in the direction indicated by an arrow A in (a)
Figure 12:
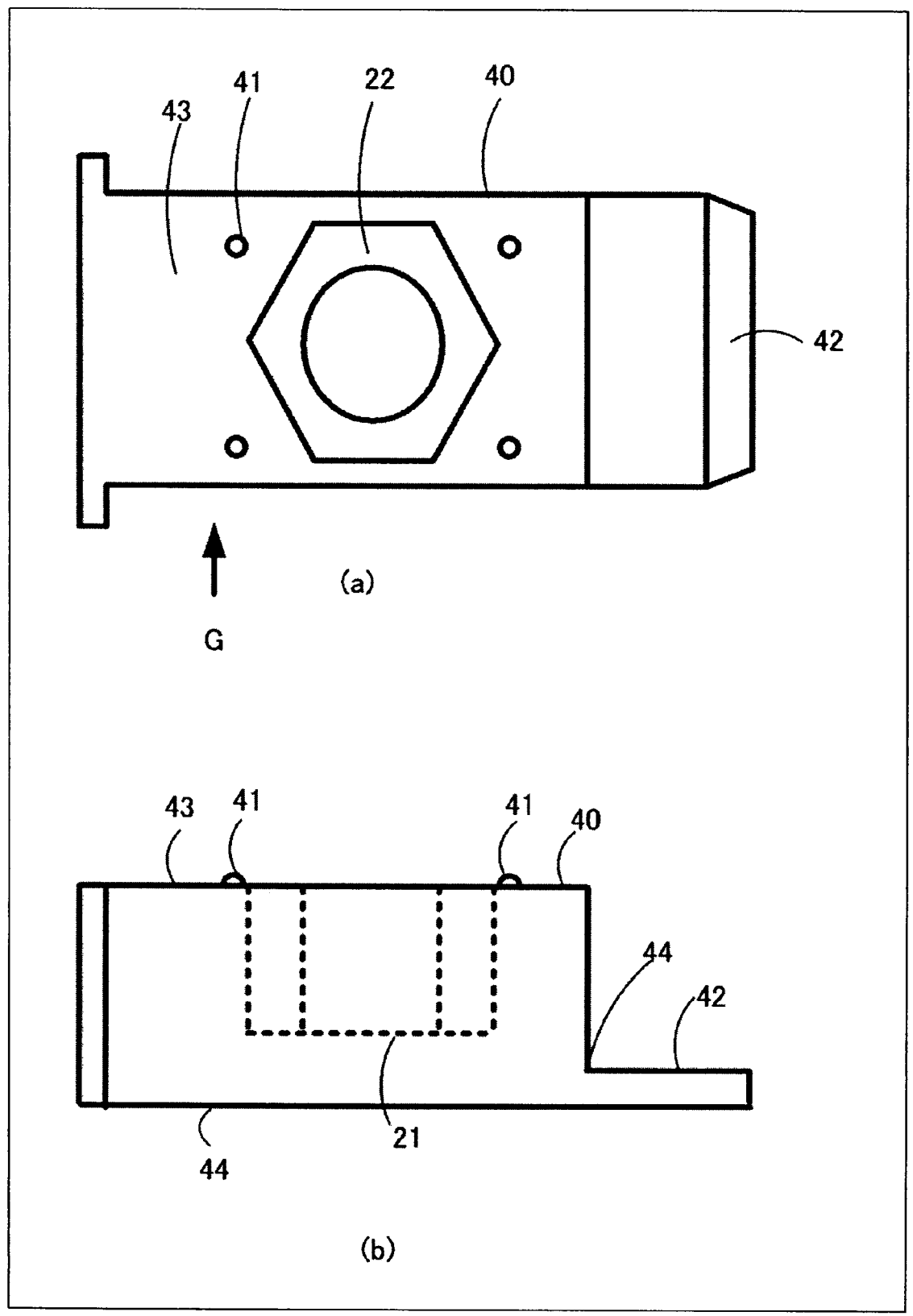
FIG. 12 is a configuration diagram of a resin body (commonly referred to as "nut glove") depicted in FIG. 11, where (a) is a plan view of primary components; and (b) is a cross-sectional view of the primary components as viewed in the direction indicated by an arrow G in (a)

FIG. 11 is a configuration diagram of a semiconductor module of a third embodiment of the present invention. In FIG. 11, (a) is a plan view of primary components; and (b) is a cross-sectional diagram of the primary components as viewed in the direction indicated by an arrow A of (a) in FIG. 11. FIG. 12 is a configuration diagram of a resin body (commonly referred to as "nut glove") depicted in FIG. 11. In FIG. 12, (a) is a plan view of primary components;

and (b) is a cross-sectional view of the primary components as viewed in the direction indicated by an arrow G in (a). FIG. 12 depicts the configuration of the primary components of the resin body corresponding to that of FIG. 5 referred to in the description of the semiconductor module 100 of the first embodiment.

In FIGS. 11 and 12, compared to the semiconductor module 100 of the first embodiment of the present invention depicted in FIG. 1, a semiconductor module 200 of the third embodiment of the present invention differs in that fine protrusions 41 are disposed on a surface 43 of the resin body 40 to fix the control terminal 5 thereto and that a protruded portion 42 is disposed on a tip bottom portion 44 of the resin body 40.

As depicted in FIG. 12, the protrusions 41 are disposed at plural points (four points in the third embodiment) on the surface of the resin body 40 and around the nut. Each of the protrusions 41 has an outer shape of a hemisphere. The protrusion 41 may have a dimension (height) of about 0.1 mm in the height direction (that is, the direction perpendicular to the page surface in (a) of FIG. 12 and the vertical direction in the page surface in (b) of FIG. 12), and may have the diameter of the hemisphere of about 0.1 mm. By disposing the protrusions 41, a gap between tips of the protrusions 41 and the lower faces 16 of the control terminals 5 when the resin body 40 is inserted and attached is reduced by about 0.1 mm compared to that of the case where the resin body 7 of the first embodiment is inserted and attached.

Figure 13:
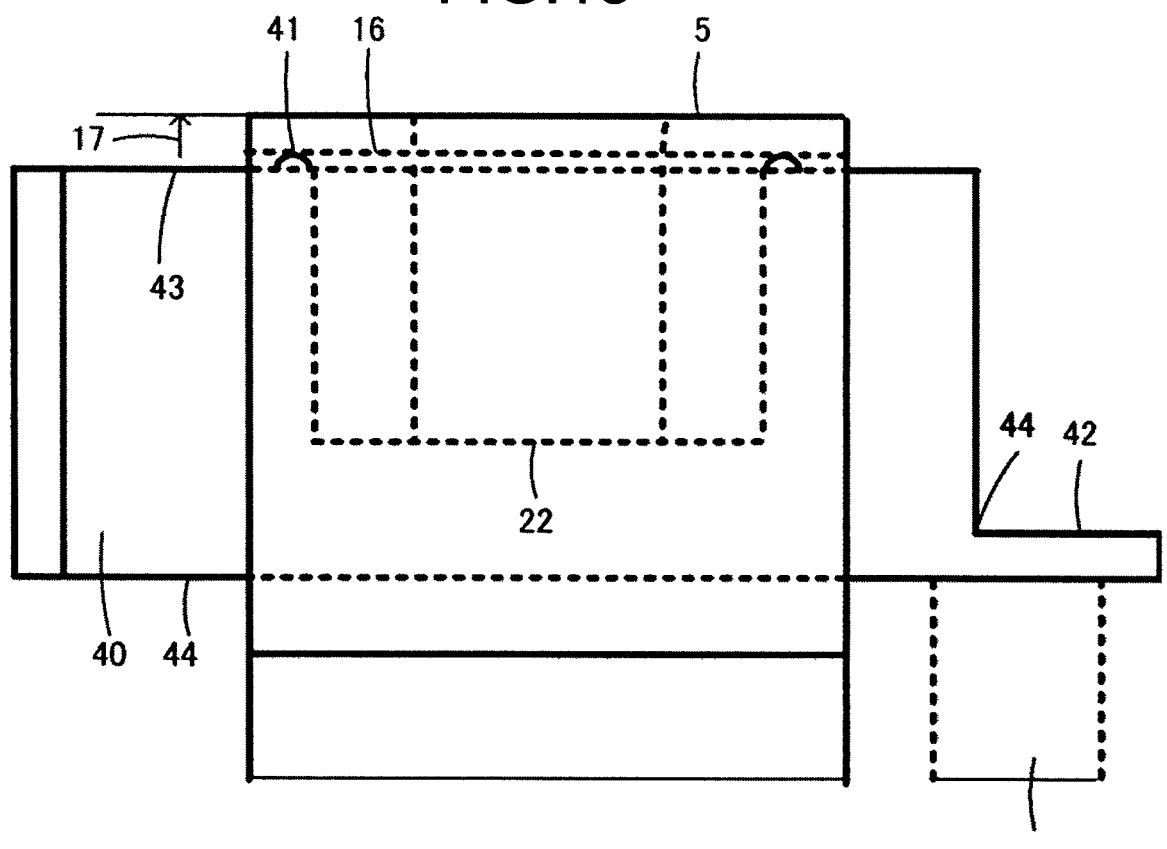
FIG. 13 is a diagram of a state of the control terminal for which the resin body of FIG. 12 is used.

FIG. 13 is a diagram of a state of the control terminal for which the resin body of FIG. 12 is used. As depicted in FIG. 13, the presence of the protrusions 41 reduces the inclination of the control terminal 5. Thus, compared to the case where the resin body 7 of FIG. 2 is used, the use of the resin body 40 enables more highly precise equalization of the surface heights 17 of the plural control terminals 5.

When the printed circuit board is attached to the control terminals 5, the use of the resin body 40 causes the bottom faces of the control terminals 5 to be in contact with all the protrusions 41 formed on the resin body 40. Thus, the surface heights of the control terminals 5 can be further equalized with higher precision after the attachment of the printed circuit board than before the attachment thereof. The use of the resin body 40 enables the printed circuit board to be attached to be flat and therefore, the stress applied to the printed circuit board becomes small and this is advantageous.

The protruded portion 42 functions as a guide when the resin body 40 is placed on the footings formed inside the resin case 8. In this manner, the disposition of the protruded portion 42 on the resin body 40 enables easy insertion and easy attachment of the resin body 40 into/to the resin case 8.

Figure 14:
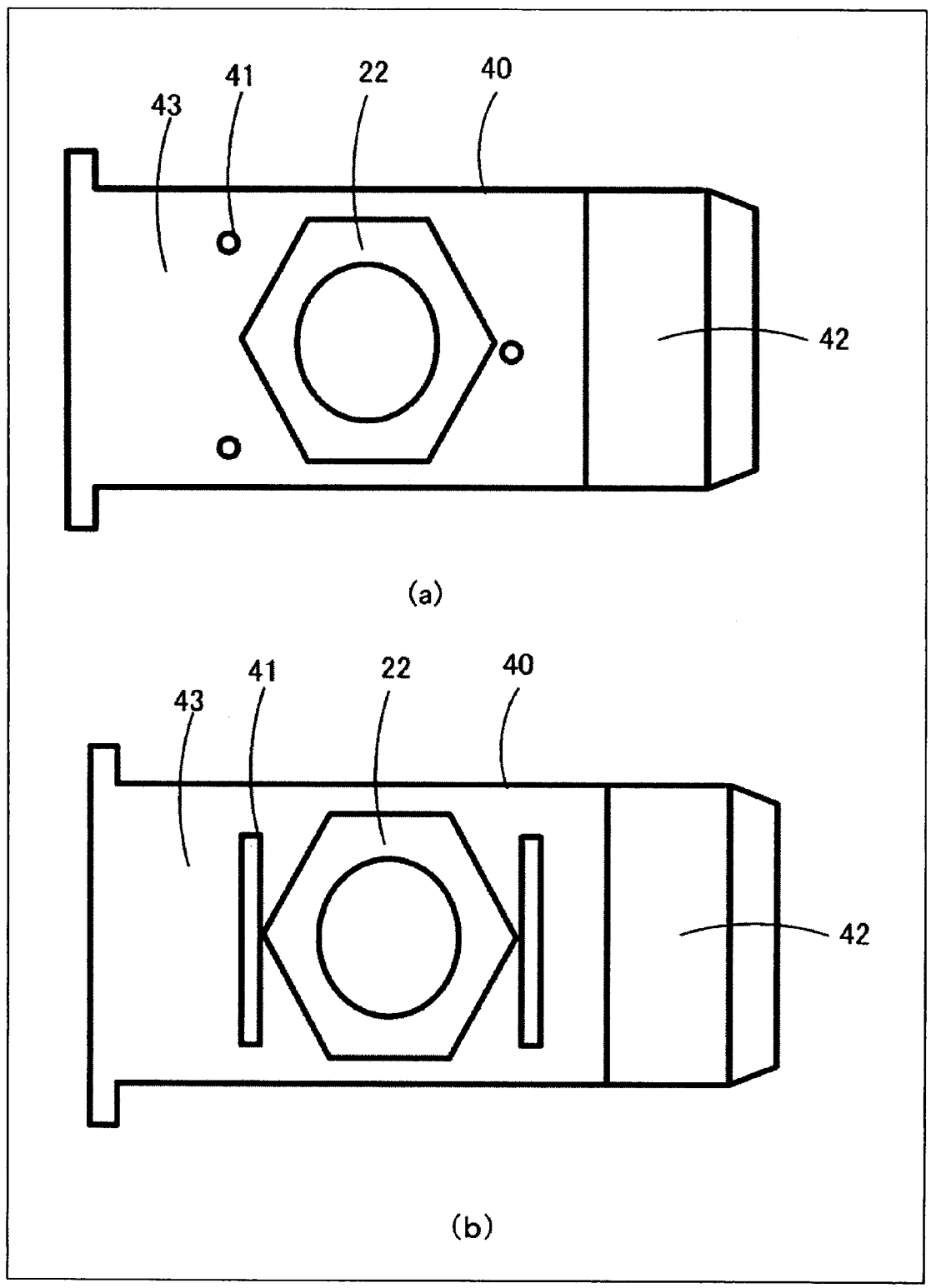
FIG. 14 depicts variations of protrusions formed on the resin body, where (a) is a plan view of a case where three protrusions are present; and (b) is a plan view of a case where protrusions each having a linear half-tube shape are formed on both sides of a nut.
Figure 15:
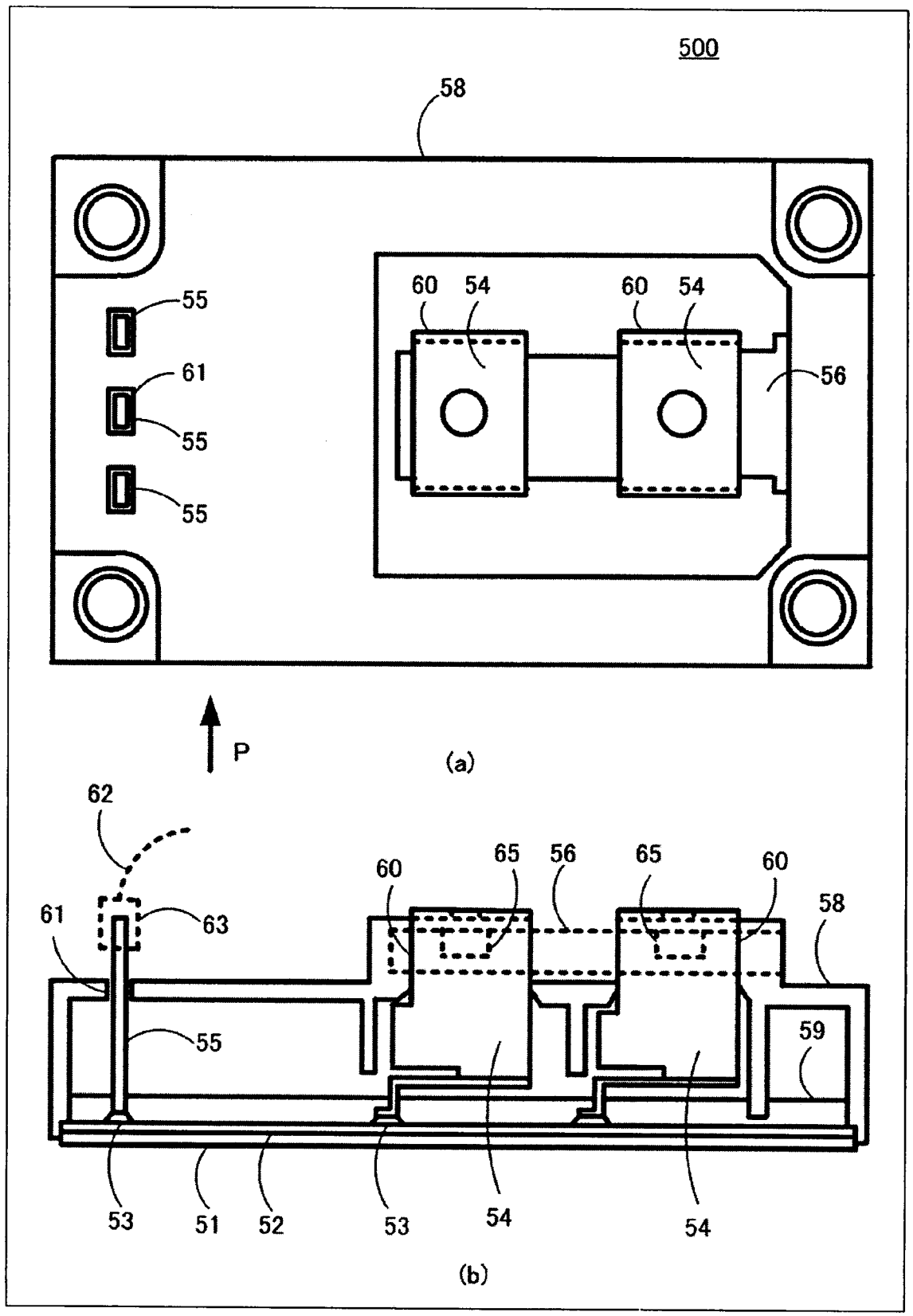
FIG. 15 is a schematic diagram of a conventional semiconductor module having independent terminals, where (a) is a plan view of primary components; and (b) is a cross-sectional diagram of the primary components of FIG. 15, as viewed in the direction indicated by an arrow P in (a)
Figure 16:
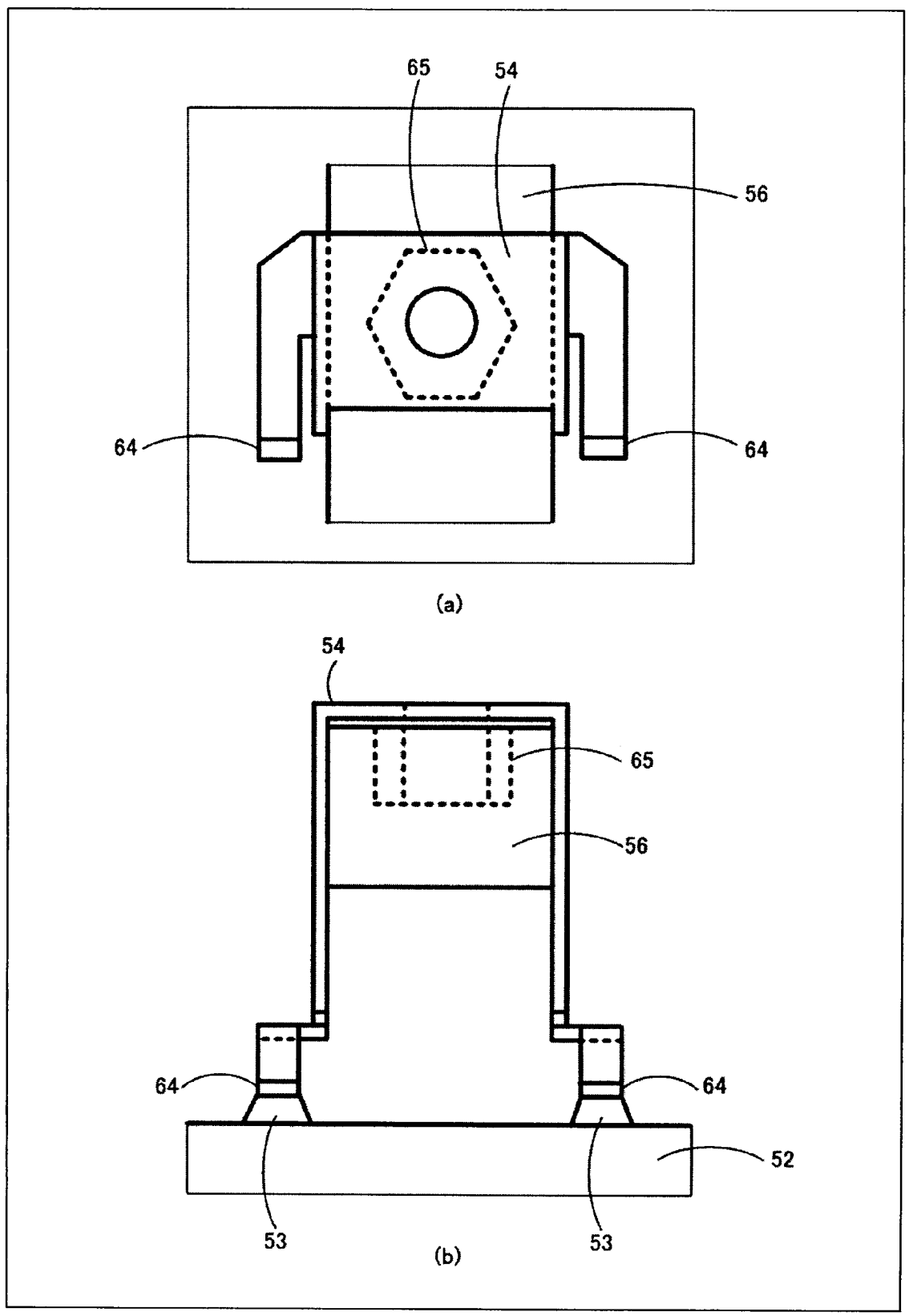
FIG. 16 is a diagram of a configuration of the resin body disposed beneath the main terminal soldered onto the conductive-patterned insulating substrate.

FIG. 14 depicts variations of the protrusions formed on the resin body. In FIG. 14, (a) is a plan view of a case where three protrusions are present; and (b) is a plan view of a case where protrusions each having a linear half-tube shape are formed on both sides of the nut. In FIG. 14, all of the heights of the protrusions 41 depicted in (a) and (b) of FIG. 14 are about 0.1 mm. Although two types of protrusions 41 are depicted as examples in FIG. 14, the types of protrusions are not limited to these. As depicted in FIG. 14, disposing the protrusions 41 on the resin body 40 enables the surface heights 17 of the control terminals 5 to be further equalized with higher precision than those of the case of FIG. 1.

The manufacturing process steps of the semiconductor module 200 of FIG. 11 are same as the process steps of FIG. 7. The semiconductor module 200 depicted in FIG. 11 can be manufactured using the same manufacturing process steps as the process steps depicted in FIG. 7. However, in the semiconductor module 200, as depicted in FIGS. 11 and 12, the protrusions 41 are formed on the surface 43 of the resin body 40 and therefore, the surface heights 17 of the control terminals 5 can equalized with high precision.

INDUSTRIAL APPLICABILITY

As described, the semiconductor module and the manufacturing method thereof according to the present invention relate to the semiconductor module including the main terminals and the control terminals that are independent terminals and the manufacturing method thereof, and are especially suitable for the semiconductor module to which highly precise equalization of the surface heights of the plural control terminals is demanded and the manufacturing method thereof.

EXPLANATIONS OF LETTERS OR NUMERALS 1 metal heat-dissipating substrate
2 conductive-patterned insulating substrate
3 solder
4 main terminal
5 control terminal
6 resin body (for main terminal)
7 resin body (for control terminals)
8 resin case
9 gel
10 opening (main terminal)
11 opening (control terminals)
12 two-leg portion
13 single-leg portion
14 footing (a portion of the control terminal)
16 lower face (control terminal)
17 surface height
18 side wall
19 contact portion
20 surface (control terminal)
21 recess (resin body)
22 nut
23 tip
24 bottom face
25 footing
26 attachment hole (control terminal)
27 threaded hole
28 attachment hole (metal heat-dissipating substrate)
29 vertical face
30 upper face (resin body)
31 gap
35 fabrication jig
36 recess (fabrication jig)
37 supporting base
41 protrusion
42 protruded portion
43 surface (resin body 40)
44 tip bottom portion

The invention claimed is:

1. A semiconductor module comprising:
a metal heat-dissipating substrate;
a conductive-patterned insulating substrate that is bonded onto the metal heat-dissipating substrate;
a semiconductor chip that is bonded onto the conductive-patterned insulating substrate;
main circuit terminals and control terminals that are bonded by solder onto the conductive-patterned insulating substrate;
a resin case that is bonded to the metal heat-dissipating substrate, the resin case comprising a first opening through which at least any one among surfaces of the main circuit terminals and surfaces of the control terminals are exposed;
a resin body that is inserted into and attached to a second opening formed on a side wall constituting the resin case, the resin body having a nut embedded therein to fix at least any one among the main circuit terminals and the control terminals; and
a resin material that fills up the resin case, wherein
the first opening comprises a tapered side wall that is narrowed toward the surface, and
the control terminals each comprise a tapered contact portion that is in contact with the tapered side wall of the first opening when the control terminals are each exposed from the first opening.

2. The semiconductor module according to claim 1, wherein
the resin body having the nut embedded therein to fix the control terminal comprises a fine protrusion that is disposed on a surface of the resin body at a point closer to an outer perimeter than to an opening of the nut embedded in the resin body and that protrudes upward when the resin body is inserted and attached beneath the control terminal.

3. The semiconductor module according to claim 1, wherein
the resin body having the nut embedded therein to fix the control terminal comprises a protruded portion disposed on a lower side of the resin body and protruding toward a head of the resin body in a direction for the resin body to be inserted into and attached to the second opening.

4. A manufacturing method of a semiconductor module, and comprising:
soldering a metal heat-dissipating substrate with a conductive-patterned insulating substrate, and the conductive-patterned insulating substrate with semiconductor chips, in a soldering furnace filled with a hydrogen atmosphere;
soldering main circuit terminals and control terminals onto the conductive-patterned insulating substrate using a predetermined fabrication jig;
covering with a resin case, the conductive-patterned insulating substrate having the main circuit terminals and the control terminals soldered thereon, the conductive-patterned insulating substrate being covered with the resin case from above such that upper portions of at least the main circuit terminals or the control terminals are exposed from a first opening that opens upward, and bonding a perimeter of a lower portion of the resin case to the metal heat-dissipating substrate; and
fixing at least any one among the main circuit terminals and the control terminals via a resin body by inserting from a second opening and attaching beneath at least any one among the main circuit terminals and the control terminal, the resin body having a nut embedded therein, thereby placing the resin body on a footing formed inside the resin case.

5. The semiconductor module according to claim 4, wherein
the first opening comprises a tapered side wall whose portion on a side of a surface is narrowed, and
the control terminal comprises a tapered contact portion that is in contact with the tapered side wall of the first opening when the control terminal is exposed from the first opening by covering the conductive-patterned insulating substrate with the resin case from above.

6. The semiconductor module according to claim 4, wherein
the resin body having the nut embedded therein to fix the control terminal comprises a fine protrusion, disposed on a surface of the resin body at a point closer to an outer perimeter than to an opening of the nut embedded in the resin body, and protruding upward when the resin body is inserted and attached beneath the control terminal, and
the fixing includes fixing the control terminal by causing the fine protrusion to abut against the control terminal when the resin body is inserted and attached beneath the control terminal.

7. The semiconductor module according to claim 4, wherein
the resin body having the nut embedded therein to fix the control terminal comprises a protruded portion disposed on a lower side of the resin body and protruding toward a head of the resin body in a direction for the resin body to be inserted into and attached to the second opening.

\* \* \* \* \*